(12) United States Patent
Tsuno

(10) Patent No.: US 6,881,990 B2
(45) Date of Patent: Apr. 19, 2005

(54) SEMICONDUCTOR DEVICE INCLUDING MOS FIELD EFFECT TRANSISTOR HAVING OFFSET SPACERS OR GATE SIDEWALL FILMS ON EITHER SIDE OF GATE ELECTRODE AND METHOD OF MANUFACTURING THE SAME

(75) Inventor: Hitoshi Tsuno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/676,264

(22) Filed: Oct. 2, 2003

(65) Prior Publication Data

US 2004/0188769 A1 Sep. 30, 2004

(30) Foreign Application Priority Data

Mar. 28, 2003 (JP) ........................................ 2003-091972

(51) Int. Cl.[7] .............................................. H01L 27/10
(52) U.S. Cl. ........................ 257/206; 257/351; 257/371
(58) Field of Search ........................... 257/206, 351–371

(56) References Cited

U.S. PATENT DOCUMENTS

| 5,994,743 | A | 11/1999 | Masuoka |
| 6,333,540 | B1 | 12/2001 | Shiozawa et al. |
| 6,387,743 | B1 | 5/2002 | Shiozawa et al. |

FOREIGN PATENT DOCUMENTS

| EP | 0 932 197 A1 | 7/1999 |
| JP | 10-223772 A | 8/1998 |
| JP | 11-220038 A | 8/1999 |
| JP | 2001-308318 A | 11/2001 |

OTHER PUBLICATIONS

K. Ota et al., "Double Offset Implantation Technique for High Performance 80nm CMOSFET with Low Gate Leakage Current", SEMI Forum 2002, ULSI Technology Seminar, Section 4, pp. 42–47.

*Primary Examiner*—Fetsum Abraham
(74) *Attorney, Agent, or Firm*—Foley & Lardner LLP

(57) ABSTRACT

First and second impurity doped regions are formed in a semiconductor substrate. A first gate electrode is formed on the first impurity doped region with a first gate insulation film interposed therebetween. A second gate electrode is formed on the second impurity doped region with a second gate insulation film interposed therebetween. A first sidewall insulation film is formed on either side of the first gate electrode. A second sidewall insulation film has a thickness different from that of the first sidewall insulation film and are formed on either side of the second gate electrode. A third sidewall insulation film is formed on the first sidewall insulation film on the side of the first gate electrode. A fourth sidewall insulation films have a thickness different from that of the third sidewall, insulation film and are formed on the second sidewall insulation film on the side of the second gate electrode.

14 Claims, 6 Drawing Sheets

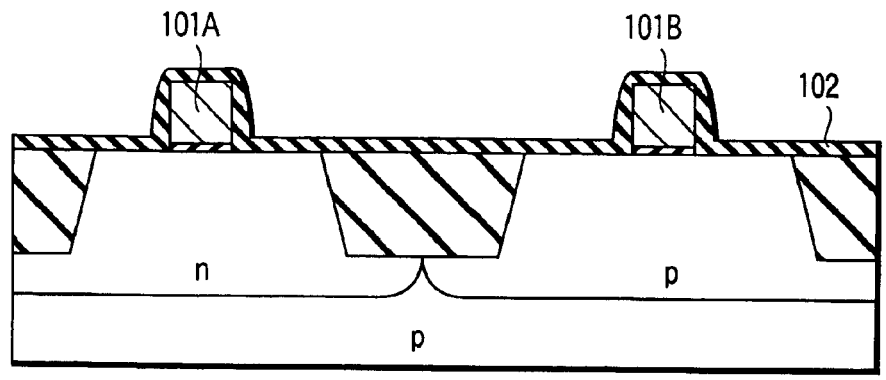
F I G. 1
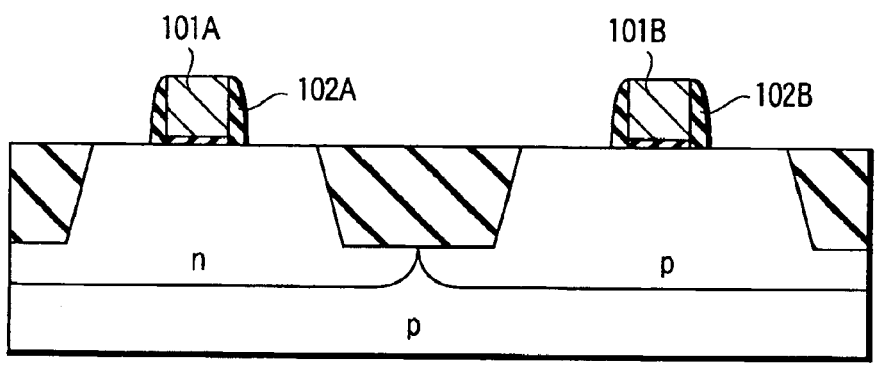
F I G. 2
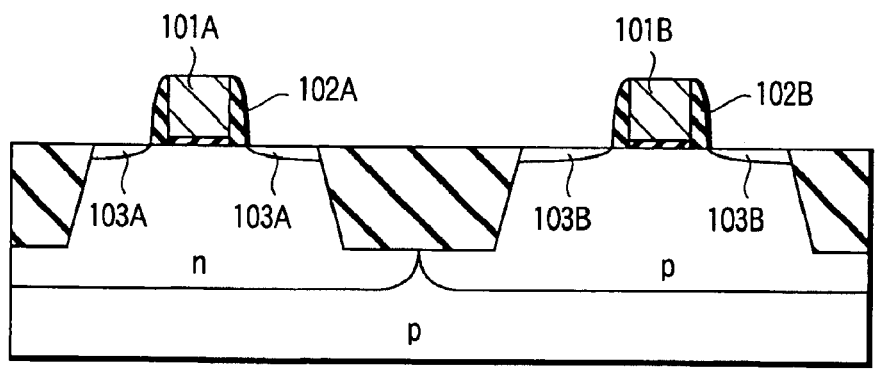
F I G. 3

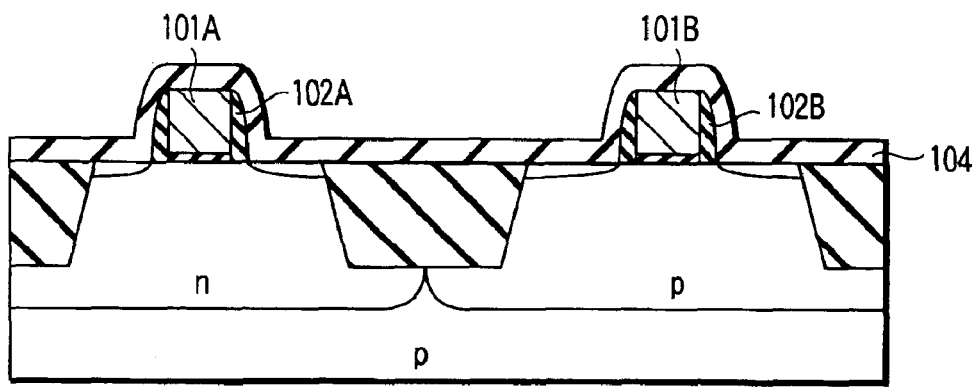
F I G. 4
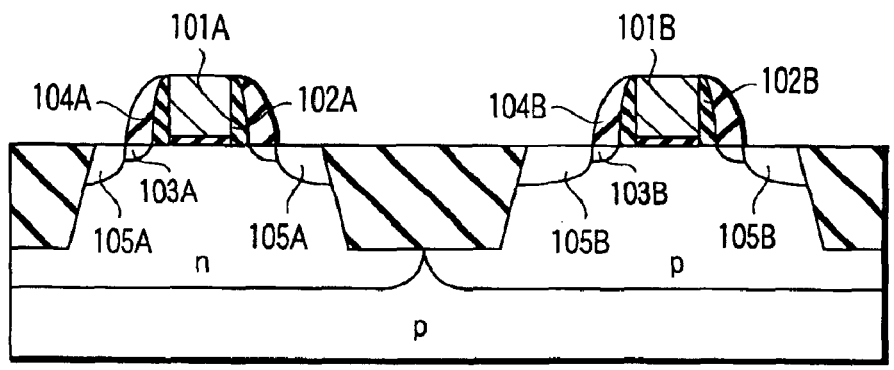
F I G. 5
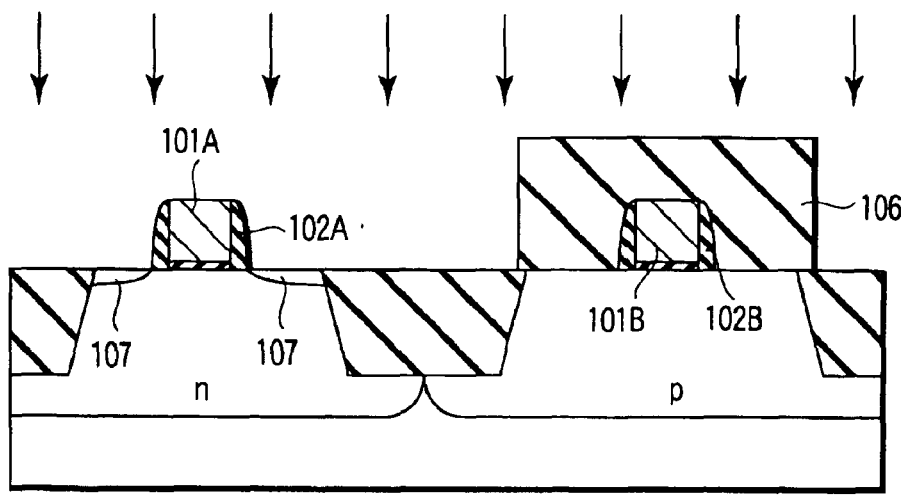
F I G. 6

SEMICONDUCTOR DEVICE INCLUDING MOS FIELD EFFECT TRANSISTOR HAVING OFFSET SPACERS OR GATE SIDEWALL FILMS ON EITHER SIDE OF GATE ELECTRODE AND METHOD OF MANUFACTURING THE SAME

CROSS-REFERENCE TO RELATED APPLICATIONS

This application is based upon and claims the benefit of priority from the prior Japanese Patent Application No. 2003-091972, filed Mar. 28, 2003, the entire contents of which are incorporated herein by reference.

BACKGROUND OF THE INVENTION

1. Field of the Invention

This invention relates to a semiconductor device including n-channel and p-channel MOS field effect transistors each having offset spacers or gate sidewall films on either side of a gate electrode and a method of manufacturing the same.

2. Description of the Related Art

In conventional MOS field effect transistors, an offset spacer or a gate sidewall film is formed on either side of a gate electrode. In order to configure such MOS field effect transistors, the same process is used for manufacturing both an n-channel MOS field effect transistor (hereinafter referred to as nMOSFET) and a p-channel MOS field effect transistor (hereinafter referred to as pMOSFET) on the same substrate, as shown in FIGS. 1 to 5. This process will be described below.

Gate electrodes 101A and 101B are formed and then a film 102 is deposited to serve as an offset spacer (see FIG. 1). Then, the film 102 is processed to form offset spacers 102A and 102B on either side of the gate electrodes 101A and 101B, respectively (see FIGS. 1 and 2). Impurities are ion-implanted into the resultant structure to form extension regions 103A and 103B with each of transistor regions masked by a resist film alternatively (see FIG. 3).

Then, a film 104 is deposited on the resultant structure to serve as a gate sidewall film (see FIG. 4). Subsequently, the film 104 is processed to form a gate sidewall films 104A and 104B on the side of the offset spacers 102A and 102B, respectively. Moreover, impurities are ion-implanted to form source/drain regions 105A under protection of rest of the transistor regions, then source/drain regions 105B are formed similarly (see FIG. 5).

Since the same process is used as described above, the offset spacers 102A and 102B of the same thickness or the gate sidewall films 104A and 104B of the same thickness are formed in both nMOSFETs and pMOSFETs. It is however understood that the optimum thickness of the offset spacer varies between the nMOSFETs and pMOSFETs in these days of the progress of miniaturization of semiconductor devices. It is thus difficult to make each of the nMOSFETs and pMOSFETs in predetermined characteristics when their offset spacers have the same thickness.

If a process from deposition to etching of a film serving as offset spacers is performed only once, their thicknesses are the same. However, if the process is done two times, effective offset spacers of different thicknesses can be formed. More specifically, first, a first offset spacers are formed on either side of each of the gate electrodes of the nMOSFET and pMOSFET. Then, an extension region is formed in one of the MOSFETs. Next second offset spacers are formed on the first offset spacers. After that, another extension region is formed in the other MOSFET. Through the above process, the effective offset spacers can be varied in thickness between the nMOSFET and pMOSFET (see, for example, K. Ohta and H. Nakaoka, "Double Offset Implantation Technique for High Performance 80 nm CMOSFET With Low Gate Leakage Current". SEMI Forum Japan 2002, ULSI Technology Seminar, Section 4, pp. 42–47).

A process of forming offset spacers of effectively different thicknesses as described above will be described with reference to the drawings.

First offset spacers 102A and 102B are formed on the sides of gate electrodes 101A and 101B, respectively. Then, impurities are ion-implanted into the resultant structure with one of transistor regions to form an extension region 107 by protecting with a resist film 106 on the other transistor region (see FIG. 6).

The resist film 106 is removed from the resultant structure and a film 108, serving as a second offset spacer, is deposited on the structure (see FIG. 7). Then, the film 108 is processed and second offset spacers 108A and 108B are formed on the sides of the first offset spacers 102A and 102B, respectively. After that, an extension region 109 is formed in one transistor region by ion-implanting impurities into the resultant structure while the other transistor region whose polarity is opposite to that of the transistor region in the first ion implantation is being protected by the resist film (see FIG. 8).

In the foregoing process, however, the deposition of a film serving as offset spacers has to be performed two times. Therefore, the variations in the thickness of the offset spacers easily increase and those in the characteristics of the MOSFETs tend to increase. Since, moreover, etching for forming the offset spacers is performed two times, the amount of etching on the surface of the substrate increases at the time of etching, and the MOS characteristics possibly deteriorate due to loss of implanted impurities. Furthermore, an undesirable excess offset spacer is formed in the MOSFETs in which impurities are ion-implanted first; therefore, the above process is disadvantageous to miniaturization of semiconductor integrated circuits.

BRIEF SUMMARY OF THE INVENTION

A semiconductor device according to an aspect of the present invention comprises; a first impurity doped region of a second conductivity type formed in a semiconductor substrate of a first conductivity type; a second impurity doped region of the first conductivity type formed in the semiconductor substrate of the first conductivity type; a first gate insulation film formed on the first impurity doped region; a first gate electrode formed on the first gate insulation film; a second gate insulation film formed on the second impurity region; a second gate electrode formed on the second gate insulation film; a first sidewall insulation film formed on either side of the first gate electrode; a second sidewall insulation film whose thickness differs from that of the first sidewall insulation film, the second sidewall insulation film being formed on either side of the second gate electrode; a third sidewall insulation film formed on a side of the first sidewall insulation film; and a fourth sidewall insulation film whose thickness differs from that of the third sidewall insulation film, the fourth sidewall insulation film being formed on a side of the second sidewall insulation film.

A method of manufacturing a semiconductor device according to another aspect of the present invention comprises: forming a first gate electrode on a first impurity doped region of a second conductivity type in a semiconductor substrate a first conductivity type; forming a second gate electrode on a second impurity doped region of the first conductivity type in the semiconductor substrate; forming a first insulation film on the first and second gate electrodes and the first and second impurity doped regions; introducing an element, which makes a change in the etching rate of the first insulation film, only into the first insulation film formed on the second impurity doped region and the second gate electrode; processing the first insulation film by anisotropic etching to form a first sidewall insulation film on either side of the first gate electrode and a second sidewall insulation film on either side of the second gate electrode, the second sidewall insulation film having a thickness different from that of the first sidewall insulation film; forming a third impurity doped region of the first conductivity type in the first impurity doped region by ion implantation using the first gate electrode and the first sidewall insulation films as a mask; and forming a fourth impurity doped region of the second conductivity type in the second impurity doped region by ion implantation using the second gate electrode and the second sidewall insulation films as a mask.

BRIEF DESCRIPTION OF THE SEVERAL VIEWS OF THE DRAWING

FIG. 1 is a cross-sectional view showing a first step of a conventional manufacturing process for a semiconductor device;

FIG. 2 is a cross-sectional view showing a second step of the conventional manufacturing process for a semiconductor device;

FIG. 3 is a cross-sectional view showing a third step of the conventional manufacturing process for a semiconductor device;

FIG. 4 is a cross-sectional view showing a fourth step of the conventional manufacturing process for a semiconductor device;

FIG. 5 is a cross-sectional view showing a fifth step of the conventional manufacturing process for a semiconductor device;

FIG. 6 is a cross-sectional view showing a first step of another conventional manufacturing process for a semiconductor device;

DETAILED DESCRIPTION OF THE INVENTION

Figure 7:
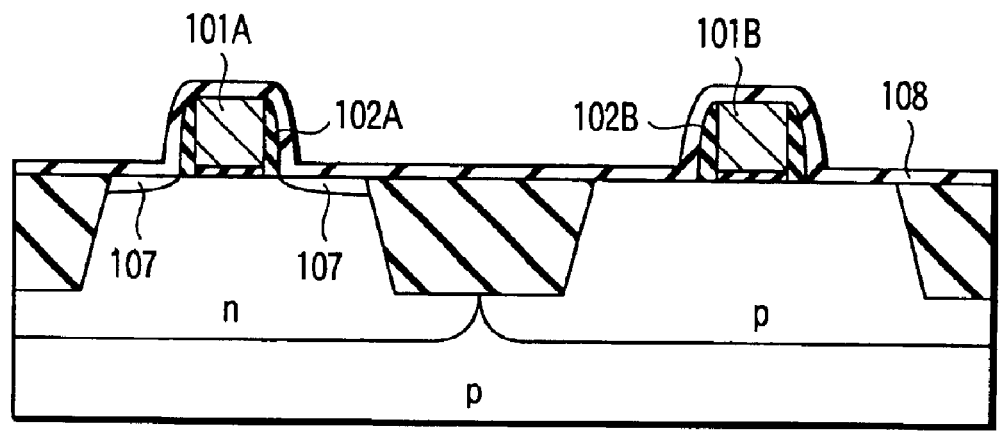
FIG. 7 is a cross-sectional view showing a second step of said another conventional manufacturing process for a semiconductor device.
Figure 8:
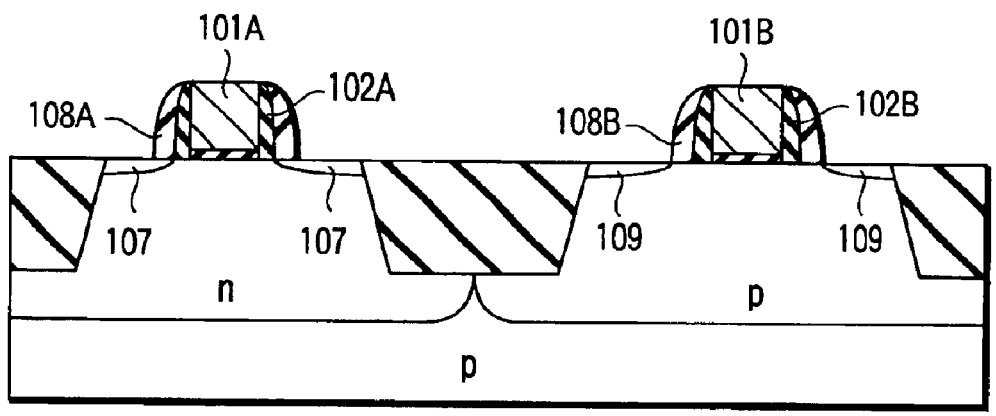
FIG. 8 is a cross-sectional view showing a third step of said another conventional manufacturing process for a semiconductor device.

Embodiments of the present invention will now be described with reference to the accompanying drawings. The same components are denoted by the same reference numerals throughout the drawings.

First Embodiment

Figure 9:
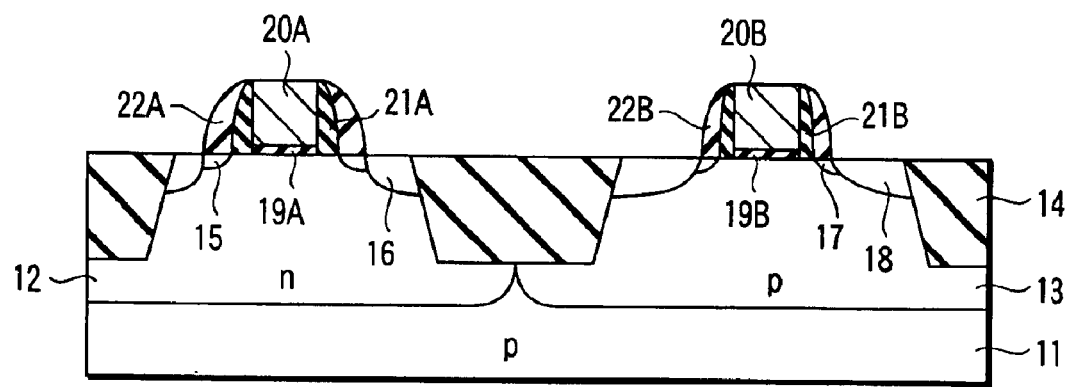
FIG. 9 is a cross-sectional view showing a structure of a semiconductor device according to an embodiment of the present invention.

First, the structure of a semiconductor device according to a first embodiment of the present invention will be described. FIG. 9 is a cross-sectional view of the structure of the semiconductor device in accordance with the first embodiment.

As shown in FIG. 9, an n-type well region (n-type impurity semiconductor region) 12 and a p-type well region (p-type impurity semiconductor region) 13 are formed on a p-type semiconductor substrate 11. An isolation insulating film 14 is formed between the n- and p-type well regions 12 and 13.

Extension regions 15, each of which is a p-type impurity semiconductor region, are formed separately from each other in an n-type well region 12 serving as an element forming region between isolation insulating films 14. Source/drain regions 16, which are a p-type impurity semiconductor region, are formed outer side of each of the extension regions 15. Further, extension regions 17, each of which is an n-type impurity semiconductor region, are formed separately from each other in a p-type well region 13 serving as another element forming region between isolation insulating films 14. Source/drain regions 18, which are an n-type impurity semiconductor region, are formed outer side of each of the extension regions 17.

A gate insulation film 19A is formed on the n-type well region 12 between the source/drain regions 16, and a gate electrode 20A is formed on the gate insulation film 19A. Offset spacers 21A are formed on either side of the gate electrode 20A. Gate sidewall films 22A are formed on the side of the offset spacers 21A.

A gate insulation film 19B is formed on the p-type well region 13 between the source/drain regions 18, and a gate electrode 20B is formed on the gate insulation film 19B. Offset spacers 21B whose thickness differs from that of the offset spacer 21A are formed on either side of the gate electrode 20B. Gate sidewall films 22B whose thickness differs from that of the gate sidewall films 22A are formed on the side of the offset spacer 21B.

The offset spacer 21B is thinner than the offset spacer 21A. For example, the bottom portion of the offset spacer 21B, which contacts the semiconductor substrate 11, is about 6 nm to 10 nm in thickness and the bottom portion of the offset spacer 21A, which contacts the semiconductor substrate 11, is about 12 nm in thickness. The gate sidewall film 22B is thinner than the gate sidewall film 22A. For example, the bottom portion of the gate sidewall film 22A, which contacts the semiconductor substrate 11, is about 70 nm in thickness and thicker than the bottom portion of the gate sidewall film 22B which contacts the semiconductor substrate 11.

The offset spacers 21A and 21B are each made of an insulation film such as a TEOS (tetraethylorthosilicate) film and a silicon nitride film. The offset spacer 21B includes an element that is not contained in the offset spacer 21A and more specifically an element that enhances the etching rate. The element that enhances the etching rate is, for example, arsenic (As), phosphorus (P), boron (B), indium (In), carbon (C) and germanium (Ge). The offset spacer 21B includes at least one of these elements.

The gate sidewall films 22A and 22B are each made up of an insulation film such as a multilayer film including a TEOS film, a silicon nitride film and a BSG (borosilicate glass) film. The gate sidewall film 22B includes an element that is not contained in the gate sidewall film 22A and more specifically an element that enhances the etching rate. The element that enhances the etching rate is, for example, arsenic (As), phosphorus (P), boron (B), indium (In), carbon (C) and germanium (Ge). The gate sidewall film 22B includes at least one of these elements.

The gate electrode 20B includes an element that is not contained in the gate electrode 20A, for example, at least one of arsenic (As), phosphorus (P), boron (B), indium (In), carbon (C) and germanium (Ge).

A pMOSFET includes a n-type well region 12, extension regions is, source/drain regions 16, a gate insulation film 19A, a gate electrode 20A, offset spacers 21A and gate sidewall films 22A. An nMOSFET includes a p-type well region 13, extension regions 17, source/drain regions 18, a gate insulation film 19B, a gate electrode 20B, offset spacers 21B and gate sidewall films 22B.

In the semiconductor device described above, the offset spacers and/or the gate sidewall films can be varied in thickness between the nMOSFET and pMOSFET. Thus each of the offset spacers and the gate sidewall films may be optimized in thickness without deteriorating from predetermined characteristics of nMOSFETs and pMOSFETs. In particular, the offset spacers can be adjusted in thickness between the nMOSFET and pMOSFET and thus the location of the extension regions, which is formed on the underside of the gate sidewall films formed outside of the offset spacers, can be controlled. Accordingly, the characteristics of the nMOSFET and pMOSFET can be optimized.

Moreover, the offset spacer and the gate sidewall film, which were undesirably thick, can be thinned. Further miniaturization of a semiconductor integrated circuit including the nMOSFETs and the pMOSFETs can be achieved.

Second Embodiment

A method of manufacturing the foregoing semiconductor device will now be described as a second embodiment. FIGS. 10 to 17 are cross-sectional views each showing a step of manufacturing the semiconductor device.

Figure 10:
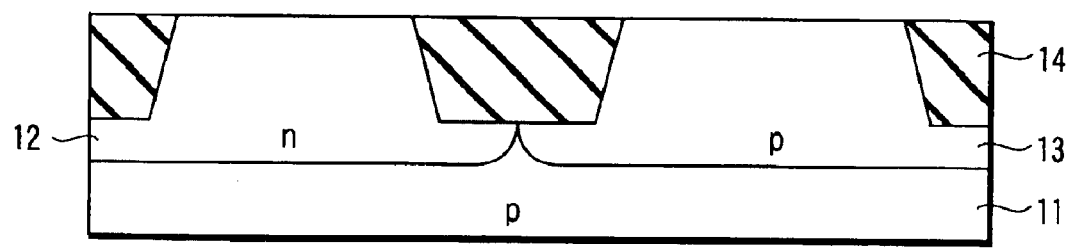
FIG. 10 is a cross-sectional view showing a first step of manufacturing a semiconductor device according to an embodiment of the present invention.
Figure 11:
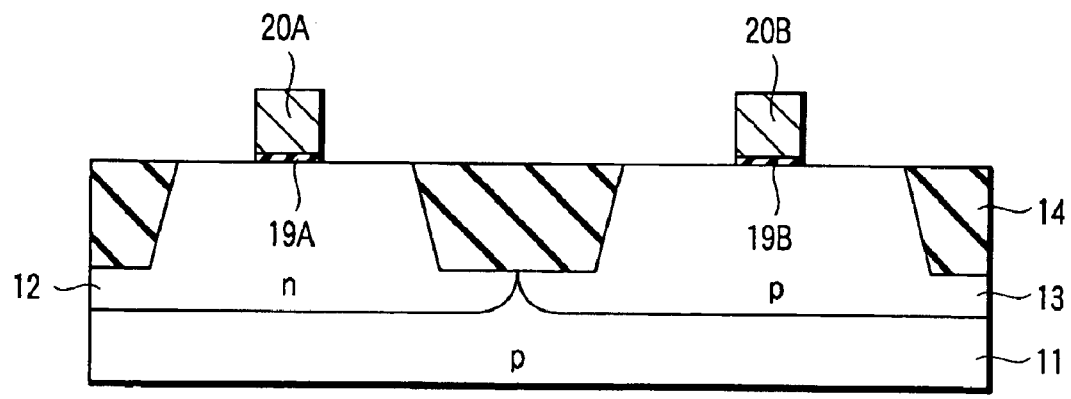
FIG. 11 is a cross-sectional view showing a second step of manufacturing the semiconductor device according to the embodiment of the present invention.

Referring to FIG. 10, an isolation insulating film 14 is formed in a p-type semiconductor substrate 11 by such process as trench isolation and LOCOS isolation to define an element forming region. Impurities are ion-implanted into the element forming region to form an n-type well region 12 and a p-type well region 13, respectively. As shown in FIG. 11, a gate insulation film is formed on the element forming regions and then a conductive film serving as a gate electrode, e.g., a polysilicon film, is deposited by CVD or the like. Furthermore, the polysilicon film is processed by RIE to form gate structure including gate electrodes 20A and 20B and gate insulation films 19A and 19B.

Figure 12:
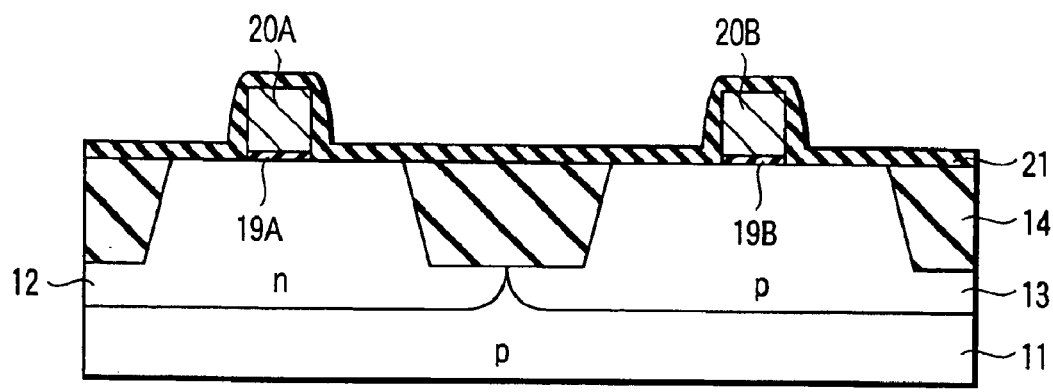
FIG. 12 is a cross-sectional view showing a third step of manufacturing the semiconductor device according to the embodiment of the present invention.

Referring to FIG. 12, an insulation film 21 serving as an offset spacer, e.g., a TEOS film or a silicon nitride film having a thickness of about 9.5 nm, is formed on the structure shown in FIG. 11 by LPCVD or the like.

Subsequently, a resistant film, which searves as a mask for an impurity introduction, is formed on one of an nMOSFET region and a pMOSFET region, and the other is opened. Then, at least one of impurity elements such as arsenic (As), phosphorus (P), boron (B), indium (In), carbon (C) and germanium (Ge) is introduced into the insulation film 21 in the opened region.

Figure 13:
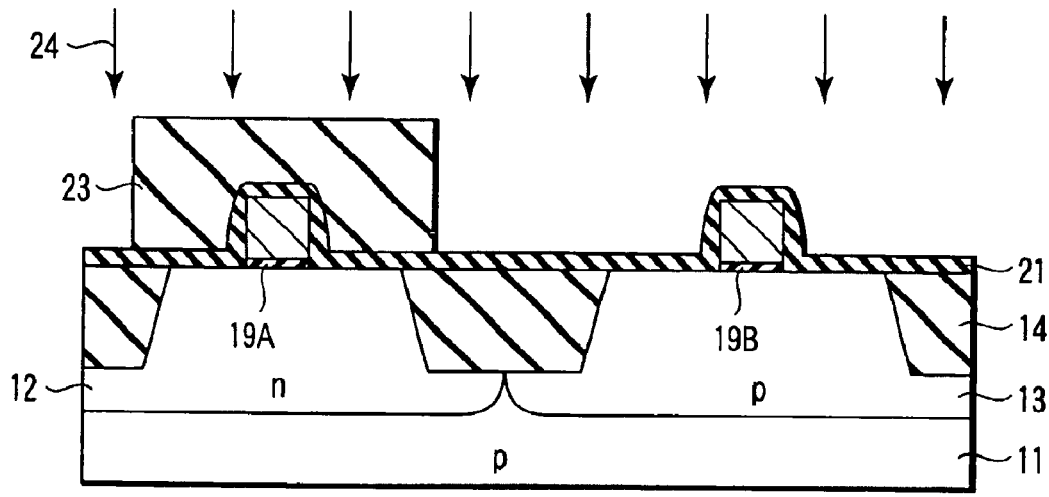
FIG. 13 is a cross-sectional view showing a fourth step of manufacturing the semiconductor device according to the embodiment of the present invention.

In the second embodiment, as shown in FIG. 13, an impurity element 24, e.g., at least one of arsenic (As), phosphorus (P), boron (B), indium (In), carbon (C) and germanium (Ge) is introduced into the insulation film 21 in the nMOSFET region by an ion implantation, while the pMOSFET region is masked with a resist film 23. The conditions for the ion implantation are as follows. When boron is ion-implanted, the acceleration voltage is 5 keV and the dose is $1.0 \times 10^{15}$ cm$^{-2}$. When arsenic is ion-implanted, the acceleration voltage is 50 keV and the dose is $1.0 \times 10^{15}$ cm$^{-2}$. When phosphorus is ion-implanted, the acceleration voltage is 15 keV and the dose is $1.0 \times 10^{15}$ cm$^{-2}$. The etching rate of the insulation film 21 on the element forming region of the nMOSFET into which the impurity 24 is introduced by the ion implantation is enhanced.

Figure 14:
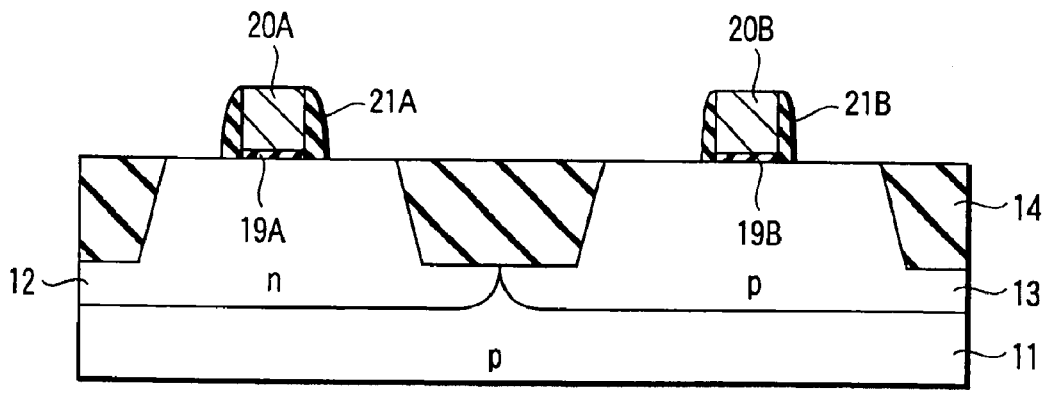
FIG. 14 is a cross-sectional view showing a fifth step of manufacturing the semiconductor device according to the embodiment of the present invention.

After that, the resist film 23 is removed and the insulation film 21 is processed by an anisotropic etching such as RIE. Thus, as shown in FIG. 14, offset spacers 21A are formed on either side of the gate electrode 20A of the pMOSFET and offset spacers 21B, which are thinner than the offset spacers 21A, are formed on either side of the gate electrode 20B of the nMOSFET. Since the etching rate of the insulation film 21 on the nMOSFET region is higher than that of the insulation film 21 on the pMOSFET region, the offset spacers 21B become thinner than the offset spacers 21A. As described above, for example, the thickness of the bottom portion of the offset spacer 21B, which contacts the semiconductor substrate 11, is designed to be about 6 nm to 10 nm and the thickness of the bottom portion of the offset spacer 21A, which contacts the semiconductor substrate 11, is designed to be about 12 nm.

If an impurity element that makes a change in the etching rate is introduced only in the insulation film serving as an offset spacer on one of transistor regions as described above, offset spacers with different thicknesses can be formed on both sides of each of the nMOSFET and pMOSFET in one deposition step of an insulation film and one etching step of the insulation film to form offset spacers.

Figure 15:
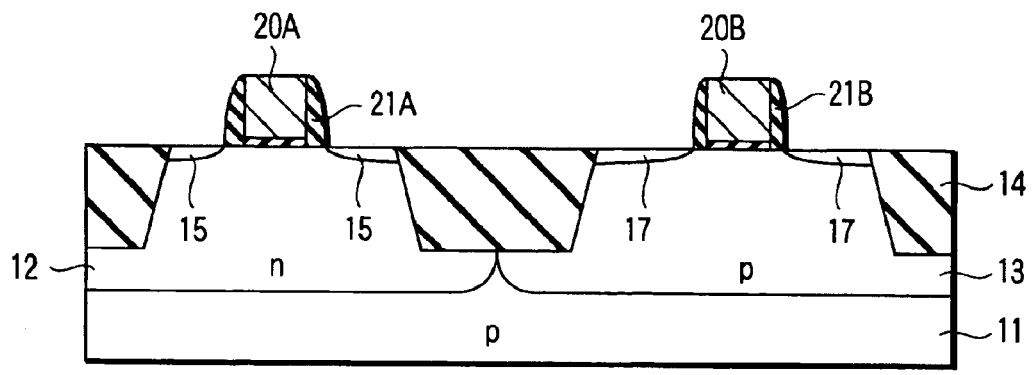
FIG. 15 is a cross-sectional view showing a sixth step of manufacturing the semiconductor device according to the embodiment of the present invention.

Then, as shown in FIG. 15, after the nMOSFET region is masked with a resist film, impurities are ion-implanted into the surface of the n-type well region 12 by using the gate electrode 20A and the offset spacer 21A as a mask to form extension regions (p-type impurity semiconductor regions) 15 between which a channel region formed beneath the gate insulation film 19A of the pMOSFET. Similarly, impurities are ion-implanted into the surface of the p-type well region 13 by using the gate electrode 20A and the offset spacer 21B as a mask to form extension regions (n-type impurity semiconductor regions) 17 between which a channel region formed beneath the gate insulation film 19B of the nMOSFET after the pMOSFET region is masked with a resist film.

Figure 16:
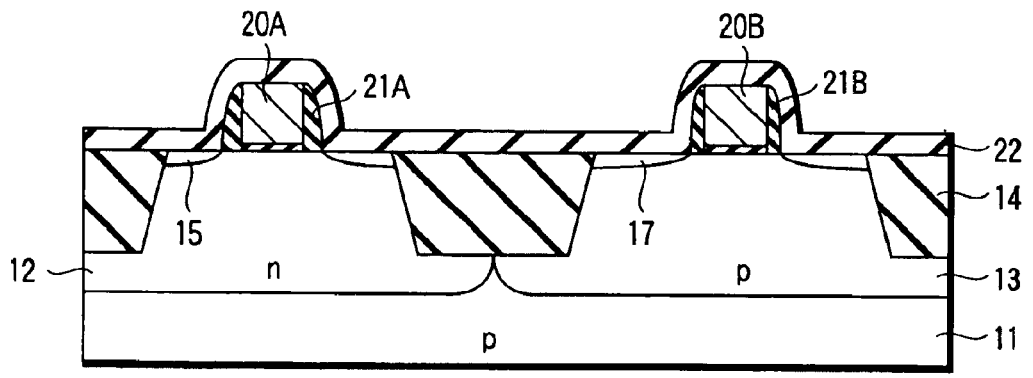
FIG. 16 is a cross-sectional view showing a seventh step of manufacturing the semiconductor device according to the embodiment of the present invention.

Subsequently, as illustrated in FIG. 16, an insulation film 22 serving as a gate sidewall film, e.g., a multilayer film including a TEOS film, a silicon nitride film and a BSG film, is formed to the thickness of about 64 nm on the structure shown in FIG. 15 by LPCVD or the like.

Furthermore, at least one of impurity elements such as arsenic (As), phosphorus (P), boron (B), indium (In), carbon (C) and germanium (Ge) is introduced into the insulation film 22 where one of an nMOSFET region and a PMOSFET region is masked with a resistant film and the other is opened.

Figure 17:
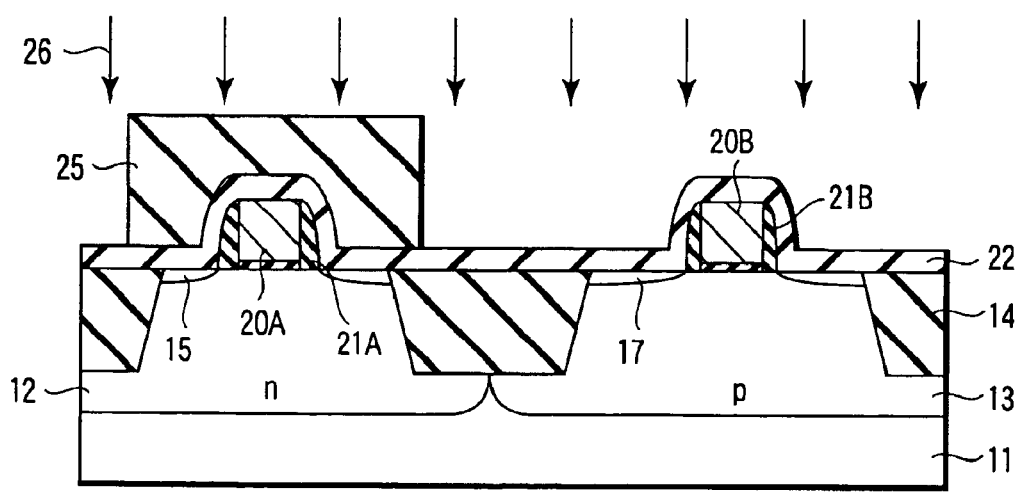
FIG. 17 is a cross-sectional view showing an eighth step of manufacturing the semiconductor device according to the embodiment of the present invention.

In the second embodiment, as shown in FIG. 17, an impurity element 26, e.g., at least one of arsenic (As), phosphorus (P), boron (B), indium (In), carbon (C) and germanium (Ge) is introduced into the insulation film 22 by the ion implantation where the pMOSFET region is masked with a resist film 25 and the nMOSFET region is opened. The etching rate of the insulation film 22 on the nMOSFET region into which the impurity element 26 is introduced is enhanced.

After that, the resist film 25 is removed and the insulation film 22 is processed by an anisotropic etching such as RIE. Thus, as shown in FIG. 9, a gate sidewall films 22A are formed on the offset spacers 21A on either side of the gate electrode 20A in the pMOSFET and a gate sidewall films 22B are formed on the offset spacers 21B on either side of the gate electrode 20B in the nMOSFET. Since the etching rate of the insulation film 22 on the nMOSFET region is higher than that of the insulation film 22 on the pMOSFET region, the gate sidewall films 22B become thinner than the gate sidewall films 22A. As described above, for example, the thickness of the bottom portion of the gate sidewall film 22A, which contacts the semiconductor substrate 11, is about 70 nm, and the bottom portion of the gate sidewall film 22B, which contacts the semiconductor substrate 11, is thinner than that of the gate sidewall film 22A.

If an impurity element that makes a change in the etching rate is introduced in the insulation film serving as a gate sidewall film on only one of transistor regions as described above, gate sidewall films with different thicknesses can be formed on both sides of each of the nMOSFET and pMOSFET in one deposition step of a gate sidewall insulation film and one etching step of the insulation film.

Then after the nMOSFET region is masked with a resist film, impurities are ion-implanted into the surface of the n-type well region 12 by using the gate electrode 20A, offset spacers 21A and gate sidewall films 22A as a mask to form source/drain regions (p-type impurity semiconductor region) 16 outer side of each extension regions 15 between which a channel region formed beneath the gate insulation film 19A of the pMOSFET. Similarly, impurities are ion-implanted into the surface area of the p-type well region 13 by using the gate electrode 20B, offset spacers 21B and gate sidewall films 22B as a mask to form source/drain regions (n-type impurity semiconductor region) 18 outer side of each extension regions 17 between which a channel region formed beneath the gate insulation film 19B of the nMOSFET after the pMOSFET region is masked with a resist film.

The semiconductor device shown in FIG. 9 is manufactured through the steps described above.

In the manufacturing steps describe above, the deposition of the insulation film 21 serving as an offset spacer is performed once and so is the etching of the insulation film 21 to form an offset spacer. The variation in the thickness of the offset spacer can thus be reduced against that in the case where the deposition and etching are each performed two times and more. Consequently, the variation in the location of the extension region formed using an offset spacer as a mask, which is due to the variation in the thickness of the offset spacer, can be decreased. As a result the variations in the characteristics of the MOSFET transistors can be reduced. Since, moreover, the offset spacers can be adjusted in different thickness between the nMOSFET and pMOSFET, the extension regions can be formed in the optimum position, outside of the offset spacers. Hence, the characteristics of the nMOSFET and pMOSFET can be optimized in predetermined values.

Another advantage of the present invention is to reduce deteriorations of MOSFETs due to a dose loss of doped impurities in a surface of the element forming region. The does loss is caused by an undesired excess etching of the surface of the element forming region during the insulation film etching to form offset spacers. An nMOSFETs and a pMOSFET with less variations in characteristics can be achieved by a process with only one step of deposition and etching of insulation film to form offset spacers against an nMOSFET and a pMOSFET produced by a process with two and more steps of deposition and etching of insulation film to form offset spacers.

According to the method of manufacturing the semiconductor device described above, the offset spacers or the gate sidewall films can be adjusted in different thickness between the nMOSFET and pMOSFET without causing the problem that the number of steps greatly increases, the variations in the characteristics of MOSFETs increase due to the increase in variations in the thickness of the offset spacers, or the characteristics of MOSFETs deteriorate due to the increase in the amount of etching for the substrate when the deposited film is etched to form an offset spacer. Accordingly, the characteristics of the MOSFETs can easily be optimized. Furthermore, the offset spacers and the gate sidewall films, which were undesirably thick, can be thinned and thus the semiconductor integrated circuit can be miniaturized further.

According to the first and second embodiments described above, there can be provided a semiconductor device and a method of manufacturing the semiconductor device in which the offset spacers or the gate sidewall films can be adjusted in different thickness between an nMOSFET and a pMOSFET without causing the problem of a great increase in the number of steps, an increase in the variations of characteristics of MOSFETs or the deterioration of characteristics.

The above-described embodiments can be executed alone-or in combination. Each of the embodiments includes inventions in various stages and these inventions can be extracted from appropriate combinations of a plurality of components disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a first impurity doped region of a second conductivity type formed in a semiconductor substrate of a first conductivity type;

a second impurity doped region of the first conductivity type formed in the semiconductor substrate of the first conductivity type;

a first gate insulation film formed on the first impurity doped region;

a first gate electrode formed on the first gate insulation film;

a second gate insulation film formed on the second impurity doped region;

a second gate electrode formed on the second gate insulation film;

a first sidewall insulation film formed on either side of the first gate electrode;

a second sidewall insulation film whose thickness differs from that of the first sidewall insulation film, the second sidewall insulation film being formed on either side of the second gate electrode;

a third sidewall insulation film formed on the first sidewall insulation film on the side of the first gate electrode; and a fourth sidewall insulation film whose thickness differs from that of the third sidewall insulation film, the fourth sidewall insulation film being formed on the second sidewall insulation film on the side of the second gate electrode.

2. The semiconductor device according to claim 1, wherein the second sidewall insulation film is thinner than the first sidewall insulation film.

3. The semiconductor device according to claim 2, wherein the fourth sidewall insulation film is thinner than the third sidewall insulation film.

4. The semiconductor device according to claim 1, wherein:

the first sidewall insulation film is an offset spacer used to form a first extension region in the first impurity doped region, a first channel region formed beneath the first gate insulation film being interposed between the first extension region; and the second sidewall insulation film is an offset spacer used to form a second extension region in the second impurity doped region, a second channel region formed beneath the second gate insulation film being interposed between the second extension regions.

5. The semiconductor device according to claim 4, wherein:

the third sidewall insulation film is a gate sidewall film used to form a first source/drain region in the first impurity doped region and outer side of each of the first extension regions between which the first channel region is interposed; and the fourth sidewall insulation film is a gate sidewall film used to form a second source/drain region in the second impurity doped region and outer side of each of the second extension regions between which the second channel region is interposed.

6. The semiconductor device according to claim 5, wherein:

the first gate electrode, the first gate insulation film, the first extension regions, and the first source/drain region make up a p-channel MOS field effect transistor in the first impurity doped region of the second conductivity type; and the second gate electrode, the second gate insulation film, the second extension regions, and the second source/drain region make up an n-channel MOS field effect transistor in the second impurity doped region of the first conductivity type.

7. The semiconductor device according to claim 1, further comprising an isolation region which isolates the first impurity doped region and the second impurity doped region from each other.

8. The semiconductor device according to claim 1, wherein the second sidewall insulation film contains an element which enhances an etching rate over that of the first sidewall insulation film.

9. The semiconductor device according to claim 8, wherein the fourth sidewall insulation film contains an element which enhances an etching rate over that of the third sidewall insulation film.

10. The semiconductor device according to claim 1, wherein the element is at least one of arsenic, phosphorus, boron, indium, carbon and germanium.

11. The semiconductor device according to claim 9, wherein the second gate electrode contains an element which is not contained in the first gate electrode.

12. The semiconductor device according to claim 11, wherein the element is at least one of arsenic, phosphorus, boron, indium, carbon and germanium.

13. The semiconductor device according to claim 1, wherein the first sidewall insulation film and the second sidewall insulation film each include one of a TEOS film and a silicon nitride film.

14. The semiconductor device according to claim 13, wherein the third sidewall insulation film and the fourth sidewall insulation film each include a multilayer film which is made up of a TEOS film, a silicon nitride film and a BSG film.

* * * * *